(12) United States Patent
Kiuchi et al.

(10) Patent No.: US 7,147,743 B2
(45) Date of Patent: Dec. 12, 2006

(54) ENERGY-BEAM-CURABLE THERMAL-RELEASABLE PRESSURE-SENSITIVE ADHESIVE SHEET AND METHOD FOR PRODUCING CUT PIECES USING THE SAME

(75) Inventors: Kazuyuki Kiuchi, Osaka (JP); Toshiyuki Oshima, Osaka (JP); Akihisa Murata, Osaka (JP); Yukio Arimitsu, Osaka (JP)

(73) Assignee: Nitto Denko Corporation, Osaka (JP)

( * ) Notice: Subject to any disclaimer, the term of this patent is extended or adjusted under 35 U.S.C. 154(b) by 298 days.

(21) Appl. No.: 10/399,477

(22) PCT Filed: Oct. 17, 2001

(86) PCT No.: PCT/JP01/09114

§ 371 (c)(1),
(2), (4) Date: Apr. 18, 2003

(87) PCT Pub. No.: WO02/33017

PCT Pub. Date: Apr. 25, 2002

(65) Prior Publication Data

US 2004/0003883 A1    Jan. 8, 2004

(51) Int. Cl.
*B32B 31/28* (2006.01)
*C09J 7/02* (2006.01)

(52) U.S. Cl. .............................. 156/272.2; 156/275.5; 156/275.7; 428/40.2; 428/41.8; 428/42.3; 428/200; 428/202; 428/343; 428/345; 428/352; 428/355 R; 428/355 BL

(58) Field of Classification Search ............... 428/40.2, 428/41.8, 42.3, 200, 202, 343, 345, 352, 428/355 R, 355 RA, 355 BL; 156/272.2–275.7
See application file for complete search history.

(56) References Cited

U.S. PATENT DOCUMENTS

| 4,176,702 A | * | 12/1979 | Seiberling ............... 152/209.6 |
| 5,441,810 A | * | 8/1995 | Aizawa et al. ............. 428/354 |
| 2004/0000370 A1 | | 1/2004 | Kiuchi |

FOREIGN PATENT DOCUMENTS

| EP | 0 612 823 A1 | 8/1994 |
| EP | 1 033 393 A2 | 9/2000 |
| JP | 11-166164 A | 6/1999 |
| WO | WO 00/18848 A1 | 4/2000 |

\* cited by examiner

*Primary Examiner*—Sam Chuan Yao
(74) *Attorney, Agent, or Firm*—Sughrue Mion, PLLC

(57) ABSTRACT

An energy-beam-curable thermal-releasable pressure-sensitive adhesive sheet having, on at least one side of a base material, an energy-beam-curable thermo-expandable viscoelastic layer containing thermo-expandable microspheres and a pressure-sensitive adhesive layer stacked in this order. The pressure-sensitive adhesive layer has a thickness of about 0.1 to 10 μm and can be formed from a pressure-sensitive adhesive. The energy-beam-curable thermo-expandable viscoelastic layer, on the other hand, can be formed from a tacky substance. The energy-beam-curable thermal-releasable pressure-sensitive adhesive sheet according to the invention has adhesion enough to withstand a carrying step of an adherend, causes neither winding up of the adhesive nor chipping upon cutting and facilitates peeling and collection of cut pieces after cutting. In addition, it exhibits low contamination on the adherend after peeling.

7 Claims, 1 Drawing Sheet

ENERGY-BEAM-CURABLE THERMAL-RELEASABLE PRESSURE-SENSITIVE ADHESIVE SHEET AND METHOD FOR PRODUCING CUT PIECES USING THE SAME

TECHNICAL FIELD

The present invention relates to an energy-beam-curable thermal-releasable pressure-sensitive adhesive sheet from which cut pieces, which are adherends, can readily be released and collected by irradiating with energy beams and heat treatment; and a method for producing cut pieces by using this sheet.

BACKGROUND ART

Upon cutting a semiconductor wafer or multilayer capacitor sheet into pieces of a predetermined size, conventionally known as a pressure-sensitive adhesive sheet for causing it to adhere to the wafer or sheet (adherend) and facilitating release and collection of cut pieces such as cut chips is a thermal-releasable pressure-sensitive adhesive sheet having a blowing-agent-containing pressure-sensitive adhesive layer disposed on a high elastic film or sheet base material such as plastic (JP-B-50-13878, JP-B-51-24534, JP-A-56-61468, JP-A-56-61469, JP-A-60-252681, etc.). This thermal-releasable pressure-sensitive adhesive sheet is aimed at both retention of adhesion enough for withstanding cutting of the adherend and easy release and collection of the cut pieces. Described specifically, this sheet is caused to adhere to the adherend with high adhesion, but upon collection of the cut pieces, the cut pieces can be released easily, because the expandable pressure-sensitive adhesive layer containing thermo-expandable microspheres foams or expands by heating to have a roughened surface, leading to lowering or loss of adhesion due to a decrease in the adhesion area with the adherend.

Since the adhesive layer of the above-described thermal-releasable pressure-sensitive adhesive sheet is soft and, due to thermo-expandable microspheres contained in the layer, is thick, problems such as winding up of the adhesive by a cutting blade or chipping associated with vibration of the pressure-sensitive adhesive layer occur upon cutting of the adherend. Thinning of the pressure-sensitive adhesive layer is effective for overcoming the above-described problems. If the layer is made thinner than the diameter of the thermo-expandable microspheres, however, these microspheres protrude from the surface of the layer and impair its smoothness, making it impossible to exhibit adhesion enough to retain the adherend. Accordingly, the thermal-releasable pressure-sensitive adhesive layer cannot be thinned without limitation and the above-described problem cannot always be overcome by thinning.

In addition, the conventional thermal-releasable pressure-sensitive adhesive sheet is sometimes unsuited for applications requiring low contamination such as semiconductor, because minute cohesion failure is induced by deformation of the thermo-expandable microspheres at the interface of the pressure-sensitive adhesive layer and the adherend happens to be contaminated by the adhesive transferred thereto.

DISCLOSURE OF THE INVENTION

An object of the present invention is therefore to provide an energy-beam-curable thermal-releasable pressure-sensitive adhesive sheet which has adhesion enough to withstand a transporting step after bonding or cutting step of an adherend, causes neither winding up of the adhesive nor chipping upon a cutting step, facilitates release and collection of cut pieces and is reduced in contamination on the adherend after released from the sheet; and a method for producing cut pieces by making use of this pressure-sensitive adhesive sheet.

As a result of extensive investigation with a view toward attaining the above-described object, the present inventors have found that when an energy-beam-curable thermo-expandable viscoelastic layer containing thermo-expandable microspheres and a pressure-sensitive adhesive layer are stacked in this order over at least one side of a base material, (i) tackiness is not lost even after curing of the energy-beam-curable thermo-expandable viscoelastic layer by irradiating with energy beams, whereby good retention of the adherend can be ensured, (ii) inconveniences such as winding up of the adhesive or chipping due to a cutting blade can be avoided upon cutting of the adherend because the pressure-sensitive adhesive layer can be thinned and at the same time, only the energy-beam-curable thermo-expandable viscoelastic layer is cured, (iii) cut pieces can be released and collected readily without damaging them because of thermal release properties, and (iv) the pressure-sensitive adhesive layer on the surface relaxes interfacial stress concentration induced by foaming or expansion of the thermo-expandable microspheres, whereby minute cohesion failure of the adhesive due to stress concentration can be prevented and contamination on the adherend can be lowered. Based on the above-described findings, the present invention has been completed.

In one aspect of the invention, there is thus provided an energy-beam-curable thermal-releasable pressure-sensitive adhesive sheet having, over at least one side of a base material, stacked an energy-beam-curable thermo-expandable viscoelastic layer containing thermo-expandable microspheres and a pressure-sensitive adhesive layer in the order of mention.

In another aspect of the invention, there is also provided a method for producing cut pieces, which comprises applying a material to be cut on the surface of the pressure-sensitive adhesive layer of the above-described energy-beam-curable thermal-releasable pressure-sensitive adhesive sheet, irradiating the energy-beam-curable thermo-expandable viscoelastic layer with energy beams, thereby curing the layer, cutting the material into pieces, causing the energy-beam-curable thermo-expandable viscoelastic layer to foam by heating, and releasing and collecting the cut pieces.

In a further aspect of the invention, there is also provided a method for producing cut pieces, which comprises irradiating the above-described energy-beam-curable thermal-releasable pressure-sensitive adhesive sheet with energy beams, thereby curing the energy-beam-curable thermo-expandable viscoelastic layer, applying a material to be cut on the surface of the pressure-sensitive adhesive layer, cutting the material into pieces, causing the energy-beam-curable thermo-expandable-viscoelastic layer to foam by heating, and releasing and collecting the cut pieces.

BEST MODE FOR CARRYING OUT THE INVENTION

The embodiments of the invention will hereinafter be described in detail with reference to accompanying drawings if necessary.

Figure 1:
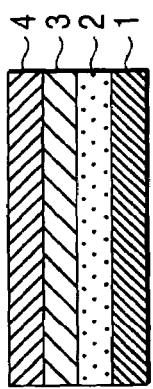
FIG. 1 is a schematic cross-sectional view illustrating one example of the energy-beam-curable thermal-releasable pressure-sensitive-adhesive sheet of the invention.

FIG. 1 is a schematic cross-sectional view illustrating one example of the energy-beam-curable thermal-releasable pressure-sensitive adhesive sheet of the invention. In this example, an energy-beam-curable thermo-expandable viscoelastic layer 2 is disposed on one side of a base material 1 and stacked thereover are a pressure-sensitive adhesive layer 3 and a separator 4 in this order. The pressure-sensitive adhesive sheet relating to the invention may be in any known or conventionally-used form such as sheet or tape.

The base material 1 serves as a supporting base for the thermo-expandable viscoelastic layer 2 and as it, a material having heat resistance enough to prevent its mechanical physical properties from being impaired by heat treatment of the thermo-expandable pressure-sensitive adhesive layer 2 is employed. Examples of such a base material 1 include, but not limited to, plastic films or sheets made of polyester, olefin resin or polyvinyl chloride. The base material 1 is preferred to be cuttable by cutting means such as a cutter used upon cutting of an adherend. When a soft polyolefin film or sheet equipped with both heat resistance and stretchability is used as the base material 1, the base material through which a cutting blade is inserted upon cutting of a material to be cut can be stretched later so that use of it is suited for cut-piece-collecting system which needs space formation between cut pieces. Since energy beams are employed for curing the energy-beam-curable thermo-expandable viscoelastic layer 2, the base material 1 (or pressure-sensitive adhesive layer 3 or the like) must be composed of a material permitting transmission of at least a predetermined amount of energy beams. The base material 1 may be a single layer or multilayer.

Although the thickness of the base material 1 can be selected as needed within an extent not damaging the operation ease or working efficiency in each step such as adhesion of an adherend, cutting of the adherend, peeling and collection of cut pieces and the like, it is usually 500 μm or less, preferably about 3 to 300 μm, more preferably about 5 to 250 μm. In order to heighten adhesion with the adjacent layer and retention of the adhesion, the base material 1 may be subjected to ordinarily employed surface treatment, for example, chemical or physical treatment such as chromic acid treatment, exposure to ozone, exposure to a flame, exposure to a high-pressure electric shock or ionizing radiation, or coating with an undercoating agent (ex. a tacky substance which will be described later).

The energy-beam-curable thermo-expandable viscoelastic layer 2 contains thermo-expandable microspheres for imparting the layer with thermal expandable properties and an energy-beam-curable compound (or energy-beam-curable resin) for imparting the layer with energy beam curability and at the same time, has viscoelasticity enough to heighten sticking properties or sticking ease. From such viewpoints, the energy-beam-curable thermo-expandable viscoelastic layer 2 is desired to be composed of a parent material having viscoelasticity and thermo-expandable microspheres and an energy-beam-curable compound (or energy-beam-curable resin) incorporated in the parent material.

As the parent material, materials having desired viscoelasticity are usable. Examples include natural rubbers, synthetic rubbers and rubber adhesives using them, silicone rubbers or pressures sensitive adhesives thereof, acrylic resins made of a homopolymer or copolymer of an alkyl (meth)acrylate [for example, (meth)acrylates of a $C_{1-20}$ alkyl such as methyl, ethyl, propyl, isopropyl, butyl, isobutyl, hexyl, octyl, 2-ethylhexyl, isooctyl, isodecyl or dodecyl], or a copolymer of the above-exemplified alkyl (meth)acrylate with another monomer [for example, a monomer containing a carboxyl group or an acid anhydride such as acrylic acid, methacrylic acid, itaconic acid, maleic acid, fumaric acid or maleic anhydride; a hydroxyl-containing monomer such as 2-hydroxyethyl (meth)acrylate, sulfonic-acid-containing monomer such as styrenesulfonic acid, a phosphoric-acid-containing monomer such as 2-hydroxyethylacryloyl phosphate, an amide-containing monomer such as (meth)acrylamide, an amino-containing monomer such as aminoethyl (meth)acrylate, an alkoxy-containing monomer such as methoxyethyl (meth)acrylate, an imide-containing monomer such as N-cyclohexyl maleimide, a vinyl ester such as vinyl acetate, a vinyl-containing heterocyclic compound such as N-vinylpyrrolidone, a styrene monomer such as styrene and α-methylstyrene, a cyano-containing monomer such as acrylonitrile, an epoxy-containing acrylic monomer such as glycidyl (meth)acrylate or vinyl ether monomer such as vinyl ether] or pressure-sensitive adhesives of the acrylic resin, polyurethane resins or pressure-sensitive adhesives thereof, and ethylene-vinyl acetate copolymers. Use of, as the parent material, components similar or analogous to the adhesive constituting the pressure-sensitive adhesive layer 3 which will be described later makes it possible to stack the energy-beam-curable thermo-expandable viscoelastic layer 2 and the pressure-sensitive adhesive layer 3 with good adhesion. Preferred examples of the parent material include tacky substances such as acrylic pressure-sensitive adhesives. The parent material may be composed of either one component or plural components.

Although no particular limitation is imposed on the energy-beam-curable compound for energy beam curing of the energy-beam-curable thermo-expandable viscoelastic layer 2 insofar as it is curable by energy beams such as visible rays, ultraviolet rays or electron beams, that permitting efficient three-dimensional network formation of the energy-beam-curable thermo-expandable viscoelastic layer 2 after irradiation with energy beams is preferred. Energy-beam-curable compounds may be used either singly or in combination.

Specific examples of the energy-beam-curable compound include trimethylolpropane triacrylate, tetramethylolmethane tetraacrylate, pentaerythritol triacrylate, pentaerythritol tetraacrylate, dipentaerythritol monohydroxypentaacrylate, dipentaerythritol hexaacrylate, 1,4-butyleneglycol diacrylate, 1,6-hexanediol diacrylate and polyethylene glycol diacrylate.

As the energy-beam-curable compound, energy-beam-curable resins may be employed. Examples of the energy-beam-curable resin include photosensitive-reactive-group-containing polymers or oligomers, for example, ester (meth)acrylate, urethane (meth)acrylate, epoxy (methacrylate), melamine (meth)acrylate and acrylic resin (meth)acrylate, each having a (meth)acryloyl group at the end of its molecule; thiol-ene addition type resins having, at the molecular end thereof, an allyl group; photo-cationic polymerization type resins; cinnamoyl-containing polymers such as polyvinyl cinnamate; diazotized amino-novolac resins; and acrylamide polymers. Examples of the polymer reactive to high energy beams include epoxidated polybutadiene, unsaturated polyester, polyglycidyl methacrylate, polyacrylamide and polyvinyl siloxane. The above-described parent material is not always necessary when such an energy-beam-curable resin is employed.

The amount of the energy-beam-curable compound is determined within an extent not impeding expansion or foaming of the thermo-expandable microspheres after curing of the thermo-expandable viscoelastic layer by irradiating with energy beams. Although it is determined as needed depending on the kind of the energy-beam-curable compound, expansion pressure of the thermo-expandable microspheres and working efficiency of cutting, it is usually added, for example, in an amount of about 1 to 100 parts by weight, preferably about 5 to 60 parts by weight, based on 100 parts by weight of the parent material in the thermo-expandable viscoelastic layer 2. Excellent cutting operation and thermal releasability can be attained simultaneously when the thermo-expandable viscoelastic layer 2 after irradiating with energy beams has a dynamic modulus of elasticity of $1\times10^5$ to $5\times10^7$ Pa (frequency: 1 Hz, sample: a film of 1.5 mm thick) in terms of storage shear modulus at the expansion initiating temperature of the thermo-expandable microspheres. This storage modulus can be adjusted by selecting the kind or amount of the energy-beam-curable compound or conditions of irradiation with energy beams as needed.

In the thermo-expandable viscoelastic layer 2, an energy beam polymerization initiator for curing the energy-beam-curable compound, and additives for imparting it with suitable viscoelasticity before and after curing by energy beams such as crosslinking agent, tackifier and vulcanizing agent may be incorporated, in addition to the above-described components.

As the energy beam polymerization initiator, known or ordinarily employed polymerization initiators can be selected as needed depending on the kind of the energy beams to be used. Such energy beam polymerization initiators may be used either singly or in combination. The energy beam polymerization initiator is added in an amount of about 0.1 to 10 parts by weight, preferably about 1 to 5 parts by weight based on 100 parts by weight of the parent material. If necessary, an energy beam polymerization accelerator may be used in combination with the above-described energy-beam polymerization initiator.

As the thermo-expandable microspheres, usable are microspheres having a substance, which is easily gasified and expands by heating, such as isobutane, propane or pentane enclosed in an elastic shell. The shell is usually made of a thermoplastic substance, hot melt substance or a substance which is broken by thermal expansion. Examples of the shell forming substance include vinylidene chloride-acrylonitrile copolymer, polyvinyl alcohol, polyvinyl butyral, polymethyl methacrylate, polyacrylonitrile, polyvinylidene chloride and polysulfone. Thermo-expandable microspheres can be prepared by a conventional manner such as coacervation or interfacial polymerization. A commercially available product such as Matsumoto Microsphere [trade name; product of Matsumoto Yushi-Seiyaku Co., Ltd.] can also be used as the thermo-expandable microspheres.

The average particle size of the thermo-expandable microspheres is usually about 1 to 80 µm, preferably about 4 to 50 µm in consideration of dispersibility and thin-film formation. In order to roughen the surface of the pressure-sensitive adhesive layer 3 by heat treatment, the thermo-expandable microspheres preferably have a sufficient strength not to be broken until the volumetric expansion ratio becomes 5 times or greater, particularly 10 times or greater. When the thermo-expandable microspheres broken at a low expansion ratio or a thermo-expandable agent not microencapsulated is employed, an adhesion area between the pressure-sensitive adhesive layer 3 and adherend is not reduced sufficiently, leading to unfavorable releasability.

Although the amount of the thermo-expandable microspheres depends on their kind, it is, for example, 5 to 200 parts by weight, preferably about 10 to 150 parts by weight, more preferably 15 to 100 parts by weight, based on 100 parts by weight of the parent material constituting the energy-beam-curable thermo-expandable viscoelastic layer 2. Amounts less than 5 parts by weight lead to insufficient reduction in adhesion after heating, while amounts exceeding 200 parts by weight tend to cause cohesive failure of the energy-beam-curable thermo-expandable viscoelastic layer 2 or interfacial fracture with the base material 1 or pressure-sensitive adhesive layer 3.

The energy-beam-curable thermo-expandable viscoelastic layer 2 can be formed in a conventional manner, for example, by applying a coating solution containing an energy-beam-curable resin or a parent material, an energy beam polymerizable compound and an energy beam polymerization initiator and, if necessary, an additive and a solvent onto a base material 1; or by applying the above-described coating solution onto a proper separator (release paper, etc.) to form an energy-beam-curable thermo-expandable viscoelastic layer 2 and then transferring it to the base material 1.

The thickness of the energy-beam-curable thermo-expandable viscoelastic layer 2 may be about 5 to 300 µm, preferably about 10 to 150 µm, more preferably about 15 to 100 µm from the viewpoints of exhibition of surface smoothness by relaxing the unevenness induced by thermo-expandable microspheres contained in the thermo-expandable viscoelastic layer 2 and prevention of vibration due to a rotating blade upon cutting of the adherend.

The pressure-sensitive adhesive layer 3 has a function of relaxing stress concentration to the interface of the adherend caused by foaming or expansion of the thermo-expandable microspheres and contains a tacky substance for imparting it with tackiness to retain the adherend. As the tacky substance, conventionally known pressure-sensitive adhesives are usable. Examples of the pressure-sensitive adhesive include pressure-sensitive adhesives of a rubber type such as natural rubbers and various synthetic rubbers, silicone type pressure-sensitive adhesives, and acrylic pressure-sensitive adhesives such as copolymers of an alkyl (meth)acrylate and another unsaturated monomer copolymerizable with this ester.

As the adhesive constituting the pressure-sensitive adhesive layer 3, an energy-beam-curable pressure-sensitive adhesive may also be used. As the energy-beam-curable pressure-sensitive adhesive, that obtained by incorporating an energy-beam-curable compound (or energy-beam-curable resin) in a tacky parent material is usable. Alternatively, an energy beam reactive pressure-sensitive adhesive polymer obtained by addition reaction, to a tacky polymer, of a compound having an energy beam reactive functional group such as carbon-carbon double bond is usable.

The pressure-sensitive adhesive layer 3 may contain, in addition to the adhesive, additives such as a crosslinking agent (for example, isocyanate crosslinking agent or epoxy crosslinking agent), tackifier (for example, rosin derivative resin, polyterpene resin, petroleum resin or oil-soluble phenol resin), plasticizer, filler, antioxidant and surfactant as needed.

The pressure-sensitive adhesive layer 3 can be formed by a proper method, for example, by applying a liquid adhesive to the energy-beam-curable thermo-expandable viscoelastic layer 2, or transferring the pressure-sensitive adhesive layer 3, which has been formed on a separator 4, onto the thermo-expandable viscoelastic layer 2.

The thickness of the pressure-sensitive adhesive layer 3 can be determined as needed depending on the using purpose of the pressure-sensitive adhesive sheet or lowering degree of the adhesion by heating. In general, when the pressure-sensitive adhesive layer 3 is too thin, shortage in adhesion or cohesion fraction upon roughening of the thermo-expandable viscoelastic layer 2 by heating tends to occur. When the pressure-sensitive adhesive layer 3 is too thick, on the other hand, it becomes difficult to conform to the surface of the thermo-expandable viscoelastic layer 2 roughened by heating. The pressure-sensitive adhesive layer 3 has a thickness of 10 μm or less (for example, about 0.1 to 10 μm), preferably 0.1 to 8 μm, especially 1 to 5 μm from the viewpoints of prevention of cohesion failure upon thermal deformation, prevention of winding up or vibration of the adhesive upon cutting of the adherend and a reduction or loss of the adhesion to the adherend.

As the separator 4, usable are base materials made of a plastic film or paper whose surface has been coated with a release agent typified by a silicone resin, long-chain alkyl acrylate resin or fluorine resin and base materials which have less tackiness and are made of a non-polar polymer such as polyethylene or polypropylene.

As described above, the separator 4 serves as a temporary support upon transfer of the pressure-sensitive adhesive layer 3 onto the energy-beam-curable thermo-expandable viscoelastic layer 2 or as a protector of the pressure-sensitive adhesive layer 3 until practical use.

The energy-beam-curable thermo-expandable viscoelastic layer 2 and the pressure-sensitive adhesive layer 3 disposed thereon can be formed not only on one side but both sides of the base material 1. It is also possible to stack the energy-beam-curable thermo-expandable viscoelastic layer 2 and the pressure-sensitive adhesive layer 3 in this order on one side of the base material 1 and to dispose a conventional pressure-sensitive adhesive layer on the opposite side.

Figure 2:
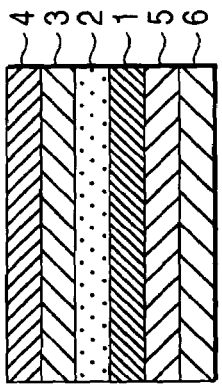
FIG. 2 is a schematic cross-sectional view illustrating another example of the energy-beam-curable thermal-releasable pressure-sensitive-adhesive sheet of the invention.

FIG. 2 is a schematic cross-sectional view illustrating another example of the energy-beam-curable thermal-releasable pressure-sensitive adhesive sheet of the present invention. In this example, an energy-beam-curable thermo-expandable viscoelastic layer 2, pressure-sensitive adhesive layer 3 and separator 4 are stacked in this order over one side of a base material 1, while a pressure-sensitive adhesive layer 5 and a separator 6 are stacked over the opposite side of the base material 1. This pressure-sensitive adhesive sheet differs from that of FIG. 1 only in disposal of the pressure-sensitive adhesive layer 5 and separator 6 on the side opposite to the side of the base material 1 having the energy-beam-curable thermo-expandable viscoelastic layer 2 and the pressure-sensitive adhesive layer 3 formed thereon.

The pressure-sensitive adhesive layer 5 contains a tacky substance. As this substance, those exemplified as the tacky substance in the pressure-sensitive adhesive layer 3 are usable. If necessary, an additive such as crosslinking agent (for example, an isocyanate crosslinking agent or epoxy crosslinking agent), tackifier (for example, a rosin derivative resin, polyterpene resin, petroleum resin or oil-soluble phenol resin), plasticizer, filler, antioxidant or surfactant may be added. It is not preferred to use or add a substance markedly disturbing the transmission of energy beams for curing the energy-beam-curable thermo-expandable viscoelastic layer 2.

Although the thickness of the pressure-sensitive adhesive layer 5 can be determined as needed within an extent not impairing operation ease upon contact bonding of the pressure-sensitive adhesive layer 3 to an adherend, cutting of the adherend, release and collection of cut pieces, it is usually about 1 to 50 μm, preferably 3 to 30 μm.

The pressure-sensitive adhesive layer 5 can be formed in accordance with that employed for the pressure-sensitive adhesive layer 3. As the separator 6, that similar to the separator 4 disposed on the pressure-sensitive adhesive layer 3 is usable. Such a pressure-sensitive adhesive sheet can be fixed to the surface of a seat by making use of its adhesive layer 5.

Figure 3:
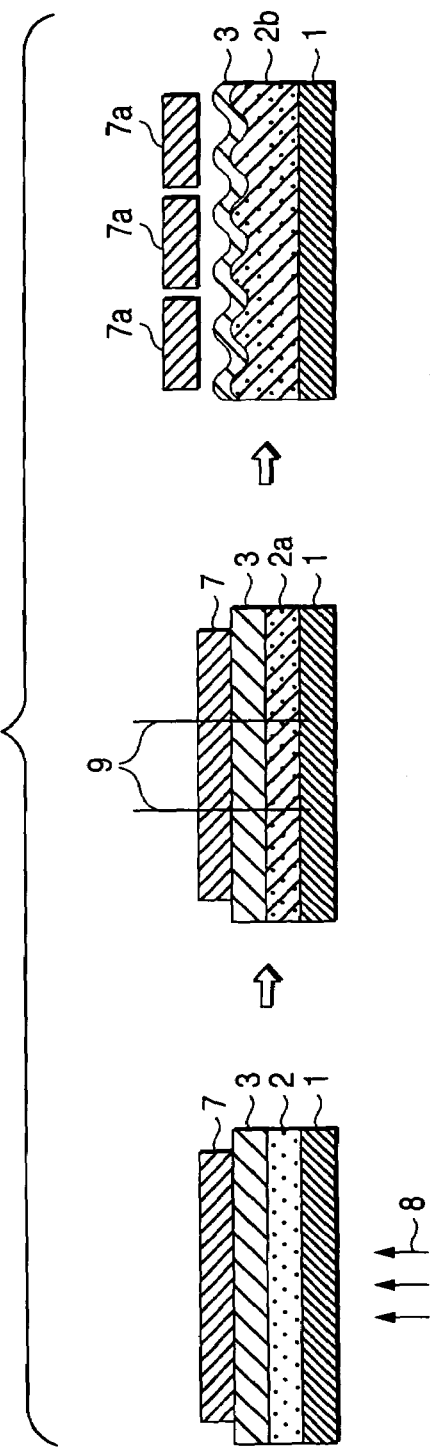
FIG. 3 is a schematic step view illustrating one example of the manufacturing process of cut pieces of the invention.

FIG. 3 is a schematic step view illustrating one example of the manufacturing process of cut pieces of the present invention. More specifically, illustrated in FIG. 3 are cross-sectional views of a series of steps of causing a material to be cut (adherend) 7 to adhere onto the surface of the pressure-sensitive adhesive layer 3 of the energy-beam-curable thermal-releasable pressure-sensitive adhesive sheet of FIG. 1 (from which the separator 4 has been released) by contact bonding, curing the energy-beam-curable thermo-expandable viscoelastic layer 2 by irradiating with energy beams 8, cutting the adherend along a cutting line 9 into pieces of a predetermined size, expanding and foaming thermo-expandable microspheres in the thermo-expandable pressure-sensitive adhesive layer 2 by heating and then peeling and collecting the cut pieces 7a. Alternatively, after curing the energy-beam-curable thermo-expandable viscoelastic layer 2 by irradiating with energy beams 8, the material to be cut (adherend) 7 is caused to adhere onto the surface of the pressure-sensitive adhesive layer 3 by contact bonding, followed by cutting along the cutting line 9.

In FIG. 3, indicated at numeral 1 is a base material, 2a an energy-beam-curable thermo-expandable viscoelastic layer cured by irradiating with energy beams, 2b a thermo-expandable pressure-sensitive adhesive layer after the thermo-expandable microspheres are expanded by heating after irradiating with energy beams.

The contact bonding of the pressure-sensitive adhesive layer 3 of the energy-beam-curable thermal-releasable pressure-sensitive adhesive sheet with the adherend 7 can be carried out, for example, by contact bonding using proper pressing means such as rubber roller, laminating roll or pressing machine. Upon contact bonding, heating at a temperature within a range not permitting expansion of the thermo-expandable microspheres or activation of a tacky substance by application of water or an organic solvent may be carried out as needed depending on the type of the tacky substance.

As the energy beams 8, visible rays, ultraviolet rays and electron beams may be used. Irradiation with the energy beams 8 may be carried out by a suitable method, but to prevent starting of expansion of the thermo-expandable microspheres due to heat upon irradiation with the energy beams 8, it is desired to suppress an irradiation time as short as possible or to air cool the radiation-curable thermal-releasable pressure-sensitive adhesive sheet to keep the temperature not to initiate expansion of the thermo-expandable microspheres.

The adherend 7 can be cut by conventional cutting means such as dicing. Heating conditions can be set as needed depending on the surface conditions or heat resistance of the adherend 7 (or cut pieces 7a), kind of the thermo-expandable microspheres, heat resistance of the pressure-sensitive adhesive sheet or heat capacity of the adherend (material to be cut). Heating is usually conducted under conditions at 350° C. or less for 30 minutes or less, with conditions at 80 to 200° C. for 1 second to 15 minutes being particularly preferred. Hot air heating, hot plate contacting or infrared ray heating can be employed as a heating method, but is not limited particularly.

When the base material 1 of the pressure-sensitive adhesive sheet has stretchability, stretching can be conducted using conventional stretching means employed for secondary stretching of a sheet.

Since the energy-beam-curable thermal-releasable pressure-sensitive adhesive sheet of the present invention has the pressure-sensitive adhesive layer 3 containing a tacky substance (adhesive), the adherend 7 can be bonded and maintained firmly thereto and it is not released by vibration upon transport. Since the pressure-sensitive adhesive layer 3 can be thinned and at the same time, the energy-beam-curable thermo-expandable viscoelastic layer 2 is cured by irradiating with energy beams prior to cutting, the adherend can be cut into a predetermined size while reducing winding up of the pressure-sensitive adhesive layer caused by a cutting blade or chipping caused by vibration of the pressure-sensitive adhesive layer, compared with the conventional thermo-expandable pressure-sensitive adhesive sheet. The energy-beam-curable thermo-expandable viscoelastic layer 2 contains thermo-expandable microspheres and therefore have thermal expansion properties so that by heating subsequent to cutting, it rapidly foams or expands and undergoes a volumetric change to form an uneven three-dimensional structure. This roughens the surface of the pressure-sensitive adhesive layer 3, leading to a drastic reduction or loss of adhesion area and, in turn, adhesion strength with the cut pieces 7a. The formation of the pressure-sensitive adhesive layer 3, curing of the energy-beam-curable thermo-expandable viscoelastic layer 2 by irradiating with energy beams and a marked reduction or loss of adhesion strength by heat treatment bring about marked improvements in operation ease or working efficiency in cutting of the adherend 7 and peeling and collection of the cut pieces 7a and also in production efficiency. In addition, owing to the pressure-sensitive adhesive layer 3 disposed outside the thermo-expandable viscoelastic layer 2 containing thermo-expandable microspheres, minute cohesion failure due to a change in the thermo-expandable microspheres does not occur at the adhesion interface with the adherend, making it possible to prevent the contamination transfer of the adherend.

The radiation-curable thermal-releasable pressure-sensitive adhesive sheet of the invention is of course usable for permanent adhesion of an adherend, but it is suited for use in the case where release from adhesion is requested or desired after a predetermined time of adhesion and attainment of the adhesion purpose. Specific examples of such a using purpose include, as well as a fixing of a material to a semiconductor wafer or ceramic multilayer sheet, a carrier tape, temporary tacking material or fixing material used upon transport of parts or temporary tacking upon fabrication of various electrical apparatuses, electron devices or displays, and a surface protecting or masking material for protecting a metal plate, plastic plate or glass plate from contamination or damage. Particularly in a manufacturing step of electron parts, it is suitably used for production of small or thin-layer semiconductor chips or multilayer capacitor chips.

This application is based on a Japanese patent application JP 2000-318645, filed Oct. 18, 2000, the entire content of which is hereby incorporated by reference, the same as if set forth at length.

The present invention will hereinafter be described in further detail by examples. It should however be borne in mind that the invention is not limited by these examples.

EXAMPLE 1

A mixed solution 1 was prepared by incorporating 0.5 part by weight of an epoxy crosslinking agent, 40 parts by weight of six-functional ultraviolet-ray polymerizable compound, 35 parts by weight of thermo-expandable microspheres ("Matsumoto Microspheres F-50D", trade name; product of Matsumoto Yushi-Seiyaku Co., Ltd.) and 2.5 parts by weight of an ultraviolet ray polymerization initiator in 100 parts by weight of an acrylic copolymer (weight-average molecular weight: 700000) composed of 80 parts by weight of ethyl acrylate, 20 parts by weight of 2-ethylhexyl acrylate and 3 parts by weight of acrylic acid. The resulting mixed solution was applied to the corona treated surface of a polyester film (base material) of 50 µm thick, followed by drying, whereby an acrylic ultraviolet-ray-curable thermo-expandable viscoelastic layer of 45 µm thick was formed.

A mixed solution 2 composed of 100 parts by weight of the above-described acrylic copolymer (adhesive) and 1 part by weight of an epoxy crosslinking agent was applied to the silicone-releasant-treated surface of a polyester film (separator), followed by drying, whereby a pressure-sensitive adhesive layer of 5 µm thick was formed.

The pressure-sensitive adhesive layer was bonded onto the acrylic ultraviolet-ray-curable thermo-expandable viscoelastic layer by contact bonding through a laminator, whereby a ultraviolet-ray-curable thermal-releasable pressure-sensitive adhesive sheet was obtained.

COMPARATIVE EXAMPLE 1

In a similar manner to Example 1 except that the ultraviolet-ray-curable thermal-releasable viscoelastic layer was formed to give a thickness of 50 µm and the pressure-sensitive adhesive layer was not disposed, an ultraviolet-ray-curable thermal-releasable pressure-sensitive adhesive sheet was obtained.

COMPARATIVE EXAMPLE 2

In a similar manner to Example 1 except for omission of the ultraviolet-ray polymerizable compound and ultraviolet-ray polymerization initiator, whereby a thermal-releasable pressure-sensitive adhesive sheet was obtained.

COMPARATIVE EXAMPLE 3

In a similar manner to Example 1 except for omission of thermo-expandable microspheres, an ultraviolet-ray curable pressure-sensitive adhesive sheet was obtained.

EXAMPLE 2

A mixed solution 3 was prepared by incorporating 3 parts by weight of an energy-beam polymerization initiator and 30 parts by weight of thermo-expandable microspheres ("Matsumoto Microspheres F-SOD", trade name; product of Matsumoto Yushi-Seiyaku Co., Ltd.) in 100 parts by weight of an energy-beam reactive polymer (weight-average molecular weight: 600000) obtained by adding, to an acrylic copolymer composed of 70 parts by weight of ethyl acrylate, 30 parts by weight of butyl acrylate and 8 parts by weight of 2-hydroxyethyl acrylate, methacryloyloxyethyl isocyanate in an amount of 0.6 equivalent (molar ratio) of the 2-hydroxyethyl group. In a similar manner to Example 1 except for the use of this mixed solution, an energy-beam-curable thermo-expandable viscoelastic layer was formed.

In a similar manner to Example 1 except for the use of a mixed solution 4 obtained by incorporating 3 parts by weight of an energy beam polymerization initiator in 100 parts by weight of the above-described energy beam reactive polymer, an energy-beam-curable pressure-sensitive adhesive layer of 3 μm thick was formed.

The energy-beam-curable pressure-sensitive adhesive layer was contact-bonded onto the energy-beam-curable thermo-expandable viscoelastic layer by a laminator, whereby an energy-beam-curable thermal-releasable pressure-sensitive adhesive sheet was obtained.

Evaluation Test

After contact bonding of a polyester film ("Lumirror S10", trade name; product of Toray Industries, Inc.) of 25 μm thick on the surface of the pressure-sensitive adhesive layer of each of the pressure-sensitive adhesive sheets (20 mm wide) obtained in Examples and Comparative Examples, 180° peel adhesion (N/20 mm, peeling rate: 300 mm/min, 23° C.) before treatment, after irradiating with ultraviolet rays and after heat treatment following the irradiation with ultraviolet rays were measured. Ultraviolet rays were irradiated from the side of the pressure-sensitive adhesive sheet for 10 seconds by using an air-cooling type high-pressure mercury lamp (46 mJ/min), while the heat treatment was conducted in a hot air drier of 130° C. for 5 minutes. Each of the pressure-sensitive adhesive sheets obtained in Examples and Comparative Examples was bonded to a semiconductor wafer of 50 μm thick. After irradiating with ultraviolet rays, dicing was conducted using a dicer ("DFD651", product of DISCO Corporation). The presence or absence of winding up of the adhesive was visually confirmed. In addition, after heating, 20 chips were picked up at random. Presence or absence of cracks of these chips was observed and moreover, chipping on the side surface of the chips after cutting was observed by an optical microscope. Irradiating with ultraviolet rays and heating were conducted under similar conditions to those described above.

Each of the pressure-sensitive adhesive sheets obtained in Examples and Comparative Examples was contact-bonded onto a 4-inch mirror-polished silicon wafer. After it was allowed to stand for 1 hour, the number of particles on the wafer peeled by irradiating with ultraviolet rays and heating treatment was measured and the number of the particles having a particle size of 0.3 μm or greater was counted.

Evaluation results are shown in Table 1. In none of Examples and Comparative Examples, adhesive transfer to a peeled polyester film or chip was visually observed upon peeling by heating.

TABLE 1

|  | Ex. 1 | Comp. Ex. 1 | Comp. Ex. 2 | Comp. Ex. 3 | Ex. 2 |
|---|---|---|---|---|---|
| Adhesion (N/20 mm) |  |  |  |  |  |
| Before treatment | 3.10 | 2.60 | 2.80 | 3.00 | 6.30 |
| After irradiation with ultraviolet rays | 1.80 | 0.30 | 2.70 | 1.30 | 0.50 |
| After irradiation with ultraviolet rays and heat treatment | 0.00 | 0.00 | 0.00 | 1.50 | 0.00 |
| Winding up of adhesive | None | None | Found | None | None |
| Cracks (the number of defectives/20 chips) | 0/20 | 0/20 | 0/20 | 20/20 | 0/20 |
| Chipping (the number of defectives/20 chips) | 1/20 | 4/20 | 20/20 | 1/20 | 0/20 |
| The number of the particles | 450 | At least 10000 | At least 10000 | 120 | 320 |

As is apparent from Table 1, in the pressure-sensitive adhesive sheet of each of Examples, curing by irradiating with ultraviolet rays causes appropriate lowering in the adhesion of the pressure-sensitive adhesive layer, and winding up of the adhesive upon cutting can be prevented. The adhesion force disappears by heat treatment, whereby cracks of chips upon picking up can be prevented and at the same time, contamination on the adherend can be decreased. The pressure-sensitive adhesive sheets of Comparative Example 1, Comparative Example 2 and Comparative Example 3, on the other hand, are inferior in particle contamination, particle contamination and chipping resistance and cracking resistance, respectively, to that of Example 1.

INDUSTRIAL APPLICABILITY

The energy-beam-curable thermal-releasable pressure-sensitive adhesive sheet according to the invention has enough adhesion to withstand transport of an adherend, is suppressed in winding up of the adhesive or chipping upon cutting, and facilitates release and collection of pieces cut with high precision. This makes it possible to markedly heighten operation ease and working efficiency in the peeling and collecting step of the cut pieces and in turn, drastically improve the productivity of cut pieces such as small-size or thin-layer semiconductor chips or multilayer capacitor chips.

The invention claimed is:

1. An energy-beam-curable thermal-releasable pressure-sensitive adhesive sheet, which comprises: a base material; an energy-beam-curable thermo-expandable viscoelastic layer comprising a viscoelastic parent material and thermo-expandable microspheres and an energy-beam-curable compound incorporated in the viscoelastic parent material; and a pressure-sensitive adhesive layer, in this order,
    wherein the energy-beam-curable compound is selected from the group consisting of trimethylolpropane triacrylate, tetramethylolmethane tetraacrylate, pentaerythritol triacrylate, pentaerythritol tetraacrylate, dipentaerythritol monohydroxypentaacrylate, dipentaerythritol hexaacrylate, 1,4-butyleneglycol diacrylate, 1,6-hexanediol diacrylate and polyethylene glycol diacrylate.

2. The energy-beam-curable thermal-releasable pressure-sensitive adhesive sheet according to claim 1, wherein the pressure-sensitive adhesive layer has a thickness of 0.1 to 10 μm.

3. The energy-beam-curable thermal-releasable pressure-sensitive adhesive sheet according to claim 1, wherein the pressure-sensitive adhesive layer comprises an energy-beam-curable pressure-sensitive adhesive.

4. The energy-beam-curable thermal-releasable pressure-sensitive adhesive sheet according to claim 1, wherein the energy-beam-curable thermo-expandable viscoelastic layer further comprises a tacky substance.

5. The energy-beam-curable thermal-releasable pressure-sensitive adhesive sheet according to claim 1, wherein the energy-beam-curable thermo-expandable viscoelastic layer after irradiating with energy beams has a storage shear modulus falling within a range of from $1\times10^5$ to $5\times10^7$ Pa at the expansion starting temperature of the thermo-expandable microspheres.

6. A method for producing cut pieces, which comprises:
  applying a material to be cut on a surface of the pressure-sensitive adhesive layer of the energy-beam-curable thermal-releasable pressure-sensitive adhesive sheet according to claim 1;
  curing the energy-beam-curable thermo-expandable viscoelastic layer by irradiating with energy beams;
  cutting the material into cut pieces,
  heating the energy-beam-curable thermo-expandable viscoelastic layer so as to foam; and
  releasing and collecting the cut pieces from the energy-beam-curable thermal-releasable pressure-sensitive adhesive sheet.

7. A method for producing cut pieces, which comprises:
  irradiating the energy-beam-curable thermal-releasable pressure-sensitive adhesive sheet according to claim 1 with energy beams, so as to cure the energy-beam-curable thermo-expandable viscoelastic layer;
  applying a material to be cut on a surface of the pressure-sensitive adhesive layer;
  cutting the material into cut pieces,
  heating the energy-beam-curable thermo-expandable viscoelastic layer to foam; and
  releasing and collecting the cut pieces from the energy-beam-curable thermal-releasable pressure-sensitive adhesive sheet.

* * * * *